(12) United States Patent
Ikuta et al.

(10) Patent No.: US 9,006,865 B2
(45) Date of Patent: Apr. 14, 2015

(54) EPITAXIAL GROWTH SUBSTRATE, SEMICONDUCTOR DEVICE, AND EPITAXIAL GROWTH METHOD

(75) Inventors: Tetsuya Ikuta, Tokyo (JP); Daisuke Hino, Tokyo (JP); Tomohiko Shibata, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 11 days.

(21) Appl. No.: 13/703,943

(22) PCT Filed: Jun. 24, 2011

(86) PCT No.: PCT/JP2011/003630
§ 371 (c)(1),
(2), (4) Date: Dec. 13, 2012

(87) PCT Pub. No.: WO2011/161975
PCT Pub. Date: Dec. 29, 2011

(65) Prior Publication Data
US 2013/0087807 A1  Apr. 11, 2013

(30) Foreign Application Priority Data
Jun. 25, 2010 (JP) .................... 2010-144994

(51) Int. Cl.
*H01L 29/20* (2006.01)
*H01L 29/12* (2006.01)
(Continued)

(52) U.S. Cl.
CPC .......... *H01L 29/12* (2013.01); *C30B 25/18* (2013.01); *C30B 29/403* (2013.01);
(Continued)

(58) Field of Classification Search
CPC ............... H01L 29/7786; H01L 21/02381
USPC .......... 257/76, 79, 94, 98, 103, 613, 615; 438/22, 29, 33, 46, 483, 487, 689
See application file for complete search history.

(56) References Cited

U.S. PATENT DOCUMENTS

2008/0122042 A1* 5/2008 Goldstein et al. ......... 257/629
2009/0114900 A1* 5/2009 Udagawa ................... 257/13

FOREIGN PATENT DOCUMENTS

JP  A-4-73930    3/1992
JP  A-2003-60234  2/2003
(Continued)

OTHER PUBLICATIONS

Jan. 15, 2013 International Preliminary Report on Patentability issued in International Application No. PCT/JP2011/003630.
(Continued)

*Primary Examiner* — Kyoung Lee
*Assistant Examiner* — Ratisha Mehta
(74) *Attorney, Agent, or Firm* — Oliff PLC

(57) ABSTRACT

In heteroepitaxially growing a group-III nitride semiconductor on a Si single crystal substrate, the occurrence of cracks initiating in the wafer edge portion can be suppressed. Region A is an outermost peripheral portion outside the principal surface, being a bevel portion tapered. Regions B and C are on the same plane (the principal surface), region B (mirror-surface portion) being the center portion of the principal surface, and region C a region in the principal surface edge portion surrounding region B. The principal surface has a plane orientation, and in region B, is mirror-surface-finished. Region B occupies most of the principal surface of this Si single crystal substrate, and a semiconductor device is manufactured therein. Region C (surface-roughened portion) has a plane orientation as with region B, however, region B is mirror-surface-finished, whereas region C is surface-roughened.

9 Claims, 4 Drawing Sheets

(51) Int. Cl.
*C30B 25/18* (2006.01)
*C30B 29/40* (2006.01)
*H01L 21/02* (2006.01)
*H01L 29/10* (2006.01)
*H01L 29/778* (2006.01)

(52) U.S. Cl.
CPC ..... *H01L 21/02381* (2013.01); *H01L 21/0243* (2013.01); *H01L 21/02463* (2013.01); *H01L 21/02546* (2013.01); *H01L 21/02658* (2013.01); *H01L 29/1075* (2013.01); *H01L 29/2003* (2013.01); *H01L 29/7786* (2013.01)

(56) References Cited

FOREIGN PATENT DOCUMENTS

| JP | A-2007-258230 | 10/2007 |
| JP | A-2009-256154 | 11/2009 |

OTHER PUBLICATIONS

Sep. 13, 2011 International Search Report issued in International Application No. PCT/JP2011/003630 (with translation).

* cited by examiner

EPITAXIAL GROWTH SUBSTRATE, SEMICONDUCTOR DEVICE, AND EPITAXIAL GROWTH METHOD

TECHNICAL FIELD

The present invention relates to an epitaxial growth substrate for epitaxially growing a compound semiconductor thereon, and a semiconductor device structured using the compound semiconductor formed on this epitaxial growth substrate. In addition, the present invention relates to an epitaxial growth method which is implemented in manufacturing this semiconductor device.

BACKGROUND ART

Group-III nitride semiconductors, which are compound semiconductors typical of GaN, have a wide band gap, and therefore, they are widely used as materials for light-emitting devices, such as blue, green, and other color LEDs (light-emitting diodes), LDS (laser diodes), and the like, and power devices. In manufacturing semiconductor devices, such as LSIs, and the like, using silicon, and the like, a wafer having a large diameter that is obtained by cutting from a bulk crystal with a large diameter is used, while, for such compound semiconductors, it is difficult to obtain a bulk crystal having a large diameter (for example, 4-inch dia or larger). Therefore, in manufacturing a semiconductor device using such a compound semiconductor, a wafer in which this compound semiconductor is heteroepitaxially grown on a substrate formed of a material dissimilar thereto is generally used. In addition, a p-n junction or a heterojunction which constitutes an LED or an LD can also be obtained by further carrying out an epitaxial growth thereon.

For example, as a material of an epitaxial growth substrate on which a GaN single crystal can be grown, sapphire, SiC, and the like, are known. With these materials, a bulk crystal having a large diameter can be relatively easily obtained, and by selecting the plane orientation therefor as appropriate, a GaN single crystal can be heteroepitaxially grown on a substrate made of such a material, whereby a wafer having a large diameter in which a GaN single crystal is formed can be obtained. However, the substrate made of such a material is expensive, and therefore, the use of a silicon (Si) single crystal substrate, which is less expensive, is being investigated.

In the case of such a heteroepitaxial growth, there exists a difference in lattice constant between the material forming the substrate and the semiconductor layer (for example, a group-III nitride). Due to such difference in lattice constant (the lattice mismatch), there may occur a crystal defect (a dislocation, or the like) or cracks in the semiconductor layer. Patent document 1 discloses a technology for reducing the adverse influence attributable to this lattice mismatch. With the technology, a buffer layer is inserted between the active layer (the layer directly related to the element operation) which is required to be of especially good quality and the Si single crystal substrate, thereby alleviating the lattice mismatch between the active layer material and the Si. Patent document 1 states that, if an AlGaInN multilayer film is formed as a buffer layer on a Si single crystal substrate the surface of which is a (111) plane, a good quality group-III nitride semiconductor layer can be obtained thereon.

Further, in the case of heteroepitaxial growth, a chemical reaction between the material forming the substrate and the semiconductor layer can have an adverse influence on the semiconductor layer grown. The adverse influence resulting from a chemical reaction occurs especially in the edge portion of a wafer, and this influence can extend to the center portion of the semiconductor layer. Patent document 2 discloses a technology for reducing this. With this technology, a protection film made of SiN is formed in the edge portion of the substrate wafer (silicon). If a group-III nitride semiconductor layer is grown thereon, the SiN will become a barrier against such chemical reaction, thereby the chemical reaction will not be caused in the edge portion of the wafer. Thus, by suppressing the chemical reaction in the edge portion, a good quality group-III nitride semiconductor layer can be obtained on the silicon substrate.

Patent Document 1

Japanese Patent Application Publication No. 2007-258230

Patent Document 2

Japanese Patent Application Publication No. 2009-256154

DISCLOSURE OF THE INVENTION

Problems to be Solved by the Invention

With the technology as disclosed in patent document 1, the occurrence of a crystal defect and cracks due to a lattice mismatch is alleviated. Therefore, if a group-III nitride semiconductor is actually heteroepitaxially grown on a Si single crystal substrate through a buffer layer, there is obtained a group-III nitride semiconductor layer which has less cracks in the center portion of the wafer (Si single crystal substrate). However, a phenomenon that a lot of small cracks occur especially in the peripheral edge portion of the wafer has often been observed. Although actually a semiconductor device (a light emitting device, a transistor, or the like) is not formed in the edge portion of a wafer, such cracks have sometimes extended to the center portion of the wafer. In such a case, those cracks will have a great deal of adverse influence on the semiconductor device manufactured. Such a problem cannot be solved even if the technology as disclosed in patent document 2 is used.

In other words, it has been difficult to suppress the initiation of such cracks in the edge portion of a wafer.

The present invention has been made in view of such a problem, and it is an object of the present invention to provide a technology which can solve the problem.

Means for Solving the Problems

In order to solve the problem as described above, the present invention provides the following scheme.

According to an aspect of the present invention, there is provided an epitaxial growth substrate, including a silicon single crystal substrate, and a buffer layer made of a group-III nitride semiconductor and formed on a principal surface of the silicon single crystal substrate, the buffer layer being a single crystal in a center portion of the principal surface of the silicon single crystal substrate, and being a polycrystal in the region around the center portion on the principal surface of the silicon single crystal substrate.

According to another aspect of the present invention, there is provided an epitaxial growth substrate, in which the principal surface of the silicon single crystal substrate is a (111) plane.

According to another aspect of the present invention, there is provided an epitaxial growth substrate, in which the center portion of the principal surface of the silicon single crystal substrate has been subjected to mirror surface finishing, and the region around the center portion on the principal surface of the silicon single crystal substrate has been subjected to surface roughening.

According to another aspect of the present invention, there is provided an epitaxial growth substrate, in which the arithmetic mean surface roughness in the region around the center portion that has been subjected to surface roughening is 10 nm or higher.

According to another aspect of the present invention, there is provided an epitaxial growth substrate, in which the silicon single crystal substrate has a tapered bevel portion in the peripheral portion located outside the principal surface, the bevel portion having been subjected to surface roughening.

According to another aspect of the present invention, there is provided an epitaxial growth substrate, in which the buffer layer includes a layer made of aluminum nitride (AlN).

According to another aspect of the present invention, there is provided an epitaxial growth substrate, in which the buffer layer includes a superlattice structure.

According to another aspect of the present invention, there is provided an epitaxial growth substrate, being made of a silicon single crystal, a center portion of a principal surface having been subjected to mirror surface finishing, and the region around the center portion on the principal surface having been subjected to surface roughening.

According to another aspect of the present invention, there is provided a semiconductor device, including any one of the above-mentioned epitaxial growth substrates, and an active layer made of a group-III nitride semiconductor formed on a principal surface of the epitaxial growth substrate.

According to another aspect of the present invention, there is provided a semiconductor device, in which, in the active layer, an operating current is caused to flow in a direction parallel to the principal surface for operation thereof.

According to another aspect of the present invention, there is provided an epitaxial growth method for heteroepitaxially growing, on a principal surface of a single crystal substrate, a growth layer made of a material different from that of the single crystal substrate, including subjecting a center portion of the principal surface of the single crystal substrate to mirror surface finishing, subjecting the region around the center portion on the principal surface to surface roughening, and thereafter epitaxially growing the growth layer.

According to another aspect of the present invention, there is provided an epitaxial growth method, in which the single crystal substrate is formed of silicon, and the growth layer is formed of a group-III nitride semiconductor.

Advantages of the Invention

The present invention is schemed as described above, whereby, in a case where a group-III nitride semiconductor is heteroepitaxially grown on a Si single crystal substrate, the occurrence of cracks which initiate in the wafer edge portion can be suppressed.

BEST MODE FOR CARRYING OUT THE INVENTION

Hereinbelow, an epitaxial growth substrate according to an embodiment of the present invention will be explained. A semiconductor device formed using this epitaxial growth substrate is a HEMT (High Electron Mobility Transistor) utilizing a heterojunction of GaN and AlGaN. When a semiconductor device is used, it is generally in the form of an individual semiconductor element (a HEMT element) which is obtained by dicing a wafer following the manufacturing process, or in the form of an individual semiconductor element which has been packaged. However, herein, the semiconductor device is not limited to that in such a form, and that in the state of a wafer prior to being subjected to dicing shall be included in the category of the semiconductor device.

Figure 1:
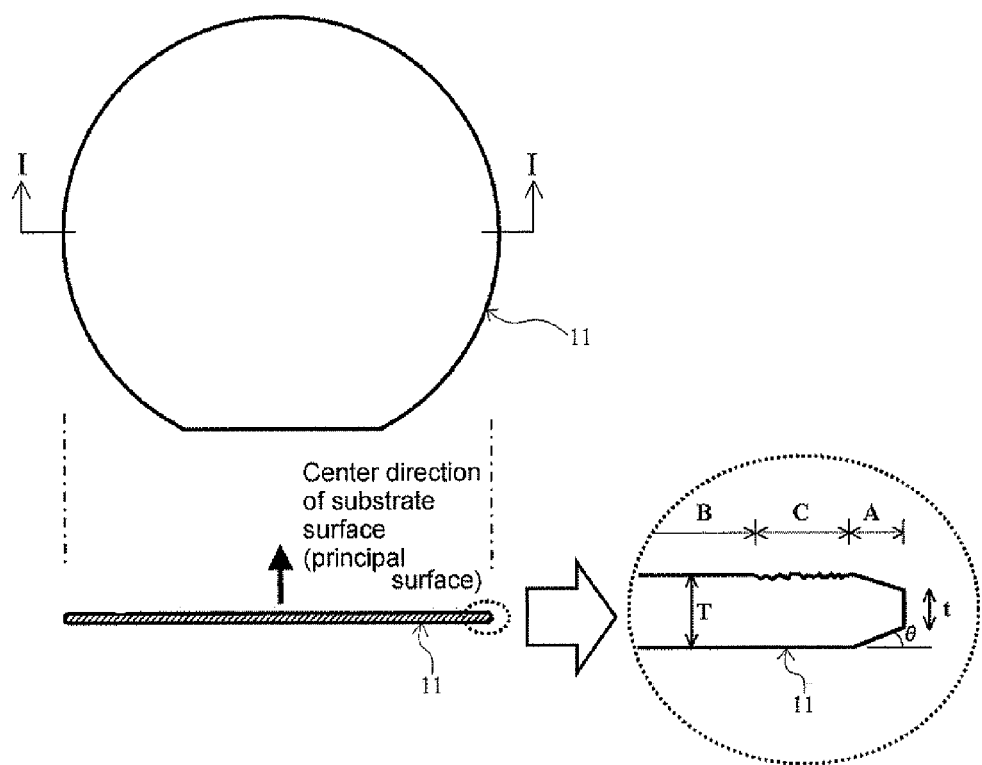
FIG. 1 is a view showing a form of a silicon single crystal substrate which is used in an epitaxial growth substrate according to an embodiment of the present invention.

With this epitaxial growth substrate, a buffer layer made of a group-III nitride semiconductor is formed on a silicon (Si) single crystal substrate. Herein, the Si single crystal substrate is a 6-inch dia substrate of a Si single crystal having a diamond structure with which the principal surface is a (111) plane. FIG. 1 gives a top view of this Si single crystal substrate 11 and a sectional view thereof taken along line I-I. The Si single crystal substrate 11 is substantially in the shape of a disk shape, however, in order to identify the orientation of the wafer in the manufacturing process of a semiconductor device using this, a portion having a straight-line geometry (an orientation flat) instead of a circular arc one is formed as a portion of the circumference of the wafer. Further, one example of sectional geometry of the edge portion of the Si single crystal substrate 11 is given at right of a sectional view in FIG. 1, being enlarged.

In the geometry of this Si single crystal substrate 11, the region A in the enlarged sectional view in FIG. 1 is an outermost peripheral portion which is located outside the principal surface, and as shown in the figure, is a bevel portion which has been subjected to tapering or surface roughening. The geometry of the bevel portion is as defined by the standard, and the width thereof is a few millimeters or smaller, and generally 0.5 mm or smaller. Further, the region B and the region C are on the same plane (the principal surface), the region B (the mirror-surface-finished portion) being the center portion of the principal surface including the central area thereof, and the region C being a region in the edge portion of the principal surface that surrounds the region B. The principal surface has a plane orientation represented by (111), and in the region B, has been subjected to mirror surface finishing. The region B occupies most of the principal surface of this Si single crystal substrate 11, and a semiconductor device is manufactured therein.

The region C (surface-roughened portion) has a plane orientation represented by (111) as with the region B, however, the region B has been subjected to mirror surface finishing, whereas the region C has been subjected to surface roughening. Herein, the surface roughening means such a working that the front face worked has irregularities giving a predetermined surface roughness. By providing this region C, the initiation and propagation of cracks in the edge portion of the wafer can be suppressed for a semiconductor layer (growth layer) which is grown on this Si single crystal substrate 11.

The surface roughness is, for example, 10 nm Ra or higher when expressed by the arithmetic mean surface roughness as defined in JIS B0601. If the value of Ra is smaller than 10 nm, the single crystal growth portion is extended, resulting in cracks being initiated. The width of the region C is preferably in the range of 0.2 mm to 10 mm, however, it is preferable to make the width of the region C the narrowest possible so long as the effect of prevention of crack initiation is positively provided. Therefore, the width of the region C is more preferably in the range of 0.5 mm to 2 mm.

Formation of such a surface-roughened portion can be carried out by using, for example, Microblast treatment. In this case, after masking of the center portion (the region B in FIG. 1) of the Si single crystal substrate (wafer) with which the entire principal surface has been subjected to mirror surface finishing, abrasive grains may be bombarded onto the entire principal surface under high pressure. In addition, chemical treatment using a chemical fluid, plasma treatment, and the like, may be used.

In the Si single crystal substrate 11, the portion in which the region C is formed is a portion around the center portion, and that portion may be over the entire region around the center portion, or a part thereof. The region C may be formed at least in a portion where cracks easily initiate, and the portion where cracks easily initiate is, for example, the orientation flat portion or the notch portion.

For example, in the case of the Si single crystal substrate 11 with which the principal surface is a (111) plane, the orientation flat portion or the notch portion is generally formed symmetrically with respect to the center direction of the wafer and in the location equivalent to the (110) plane. In this case, it is effective to form the region C in a portion which is outside the region B and constitutes the orientation flat portion or the notch portion. Further, in a case where, in the Si single crystal substrate 11 with which the principal surface is a (111) plane, the orientation flat portion or the notch portion is formed in a portion turned at an angle of 25 to 35°, 85 to 95°, or 145 to 155° from the portion equivalent to this (110) plane, cracks which propagate perpendicularly from the wafer edge portion are difficult to initiate. In this case, the region C may be formed around the portion equivalent to the (110) plane where cracks easily to initiate.

The Si single crystal substrate 11 is a single crystal in the above-mentioned form, being of either p or n conduction type, and the specific resistance thereof is not particularly limited, Si single crystal substrates having various values of specific resistance being applicable as the Si single crystal substrate 11. A B-doped p-type substrate, and a P- or As-doped n-type substrate have a resistivity in the range of, for example, 0.001 Ω·cm to 100,000 Ω·cm. Another impurity is not particularly limited. The thickness (T in FIG. 1) of the Si single crystal substrate 11 is, for example, 700 μm. The manufacturing method therefor is optional; for example, the Czochralski (CZ) method or the flat zone (FZ) method can be used. The orientation flat is formed as described above, however, the direction thereof is optional.

The Si single crystal substrate 11 having such structure is characterized in that it is provided with the region C which has been subjected to surface roughening. The structure with which the region C is not provided, and only the region A and the region B are provided, in other words, the Si single crystal substrate with which the entire principal surface has been subjected to mirror surface finishing is the same as that which is conventionally known. As described later, providing the region C can suppress the occurrence of cracks in the growth layer formed especially in the edge portion of the wafer.

Figure 2:
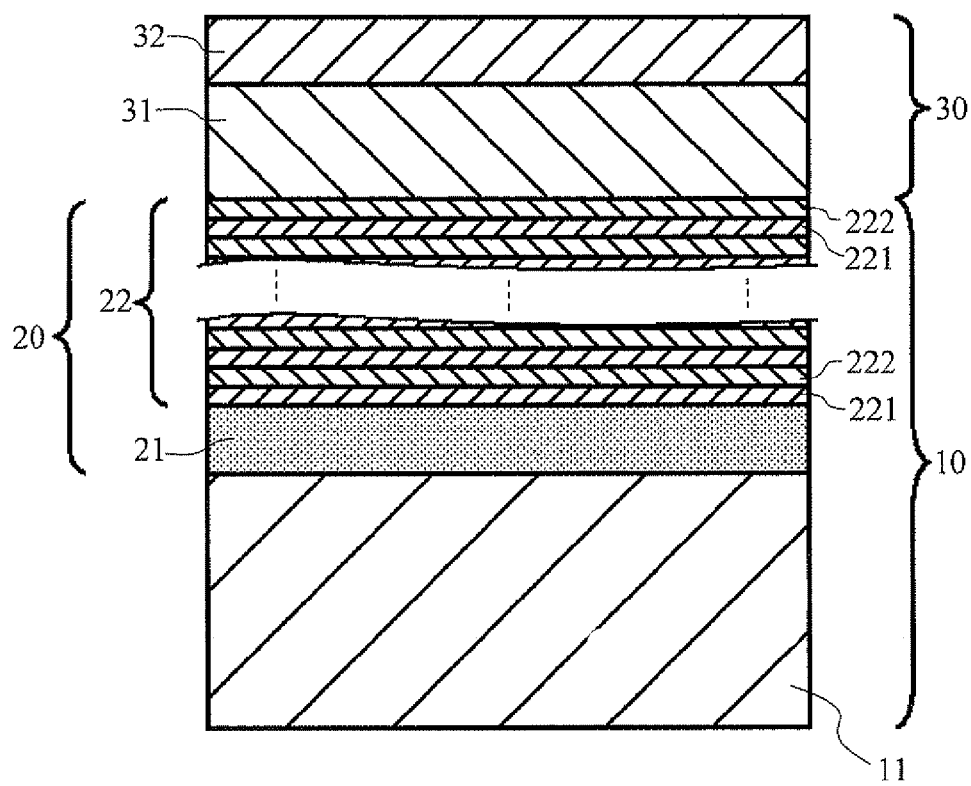
FIG. 2 is a sectional view showing a structure of a semiconductor device formed using the epitaxial growth substrate according to an embodiment of the present invention.

FIG. 2 shows a sectional structure of a semiconductor device using the epitaxial growth substrate 10 which has such Si single crystal substrate 11 as a component. On the Si single crystal substrate 11 having the above structure, the buffer layer 20 is formed to provide the epitaxial growth substrate 10. Since the HEMT is formed in the active layer 30 formed on this buffer layer 20, the structure as a semiconductor device is provided as shown in FIG. 2. The active layer 30 is comprised of a channel layer 31 and an electron supply layer 32, and the electron layer for producing an operating current in the HEMT is formed in the vicinity of the boundary between the channel layer 31 and the electron supply layer 32. The operating current flows in the region between the source electrode and the drain electrode (either of them not shown) formed on the electron supply layer 32, and the potential of the gate electrode (not shown) formed between the source electrode and the drain electrode sets either the on or off state. The buffer layer 20 is inserted between the active layer 30 and the Si substrate 11 in order to alleviate the influence of the lattice mismatch between the active layer 30 and the Si substrate 11 to thereby enhance the crystallinity of the active layer 30. Thus, the characteristics of the HEMT, the element operation of which is carried out in the active layer 30, can be improved.

The buffer layer 20 is formed by epitaxially growing an initial growth layer 21 and a superlattice laminate 22 in order. Either layer is formed of a group-III nitride semiconductor. In the case of the HEMT structure, it is required to suppress the leakage current in a longitudinal direction, and therefore the buffer layer is preferably semi-insulating. Introduction of an impurity, such as Fe, C, or Mg, can enhance the nonconductivity. In order to suppress the contamination of the active layer with an impurity, it is the most preferable to dope C.

The initial growth layer 21 is formed of, for example, aluminum nitride (AlN), the thickness thereof being, for example, 100 nm. Among the group-III elements, Ga and In easily react with Si, thereby easily causing a defect, and the defect easily causes a defect also in the layer which is epitaxially grown on the initial growth layer 21. Therefore, AlN not containing Ga and In is used particularly preferably. However, a particularly high impurity is not required, and impurities, such as Si, H, O, B, Mg, As, P, and the like, as well as Ga and In may be contained at a dosage of 1% or less in total. As described above, the buffer layer 20 is formed for alleviating the influence of the lattice mismatch between the active layer 30 and the Si single crystal substrate 11, however, among the buffer layer 20, the initial growth layer 21 is formed to suppress the reaction between the layer formed thereon (such as the superlattice laminate 22, or the like) and the Si single crystal substrate 11, thereby enhancing the crystallinity of the layers formed thereon.

The superlattice laminate 22 has a structure (superlattice structure) with which a first layer 221 and a second layer 222 are multiple-laminated periodically through epitaxial growth. The effect of the buffer layer 20 to alleviate the occurrence of a defect due to the lattice mismatch between the Si single crystal substrate 11 (Si) and the active layer 20 (a group-III nitride semiconductor) is brought about mainly by the superlattice laminate 22. The first layer 221 is formed of, for example, AlN as with the initial growth layer 21, while the second layer 222 being formed of, for example, a mixed crystal $Al_{1-x}Ga_xN$. Herein, the first layer 221 (AlN) has a band gap of 6.2 eV, while the GaN has a band gap of 3.5 eV. The band gap for the second layer 222 ($Al_{1-x}Ga_xN$) is a value between these that varies depending upon the value of x, and therefore, the band gap for the second layer 222 is smaller than that for the first layer 221. In order to enhance the dielectric strength of an HEMT in a longitudinal direction, it is preferable to increase the difference in band gap between the first layer 221 and the second layer 222. Therefore, preferably the value of x for the second layer is 0.5≤x<1 to increase the difference in composition from the first layer 221. Herein, if x is smaller than 0.5, the above-mentioned effect of alleviating the occurrence of a defect due to the lattice mismatch will be insufficient, thereby a crystal defect or cracks easily initiating in the active layer 30. Further, in a case where Al is contained, C, which can enhance the resistivity, is easily taken into the crystal lattice, resulting in the electrical effect thereof being enhanced, and therefore, it is preferable that the second layer 222 be not of GaN (the value of x be smaller than 1).

Between the growth initial layer 21 and the superlattice laminate 22, another layer formed of, for example, a mixed crystal AlGaN may be inserted.

The first layer 221 having a large band gap suppresses the tunnel current, thereby contributing to enhancing the nonconductivity of the buffer layer 20. On the other hand, the second layer 222 having a lattice constant close to that of the active layer 30 contributes to suppressing the occurrence of cracks or a warp of the wafer. Therefore, the film thicknesses of these are set as appropriate in consideration of these effects. Specifically, the first layer 221, if it is of AlN, has preferably a thickness in the range of 2 to 10 nm, with which the tunnel current is suppressed, and cracks are difficult to initiate. The second layer 222 is preferably thicker than this, i.e., 40 nm or less. The first film layer 221 and the second layer 222 are alternately laminated, and the total number of layers laminated is set as appropriate, so long as the occurrence of a defect due to the lattice mismatch between the Si single crystal substrate 11 and the active layer 30 is alleviated, and the nonconductivity of the buffer layer 20 is secured, the total number of layers laminated being set at, for example, 50 or over. However, in the superlattice laminate 22, these layers need not have the same thickness or composition.

The structure of the active layer 30 is set as appropriate according to the configuration of the semiconductor device using the active layer 30. Herein, on the buffer layer 20, a channel layer 31 and an electron supply layer 32 are formed in order. The channel layer 31 is formed of GaN, being a high impurity layer with a thickness of, for example, 0.75 µm, while the electron supply layer 32 is an n-type layer formed of $Al_{1-x}Ga_xN$ (x=0.73 or so). These are the same as those which are used in generally known GaN HEMTs. For the element operation of the HEMT, it is preferable that, on the electron supply layer 32 side of the channel layer 31, the impurity concentration be particularly reduced; for example, the C concentration is preferably reduced to $4×10^{16}$ cm$^{-3}$ or lower. However, from the viewpoint of compensating the n-type impurities in GaN, it is preferable that the C concentration be $1×10^{15}$ cm$^{-3}$ or higher.

As the structure of the active layer 30, the same structure as that of the semiconductor device using a generally known group-III nitride semiconductor can be used.

The structure as described above can be formed on the Si single crystal substrate 11 by the known MOCVD (Metal Organic Chemical Vapor Deposition) method or the MBE (Molecular Beam Epitaxy) method.

Here is a discussion about what influence the Si single crystal substrate 11 in the above structure that is configured as shown in FIG. 1 can have on the layers (the buffer layer 20 and the active layer 30) grown thereon.

Figure 3A:
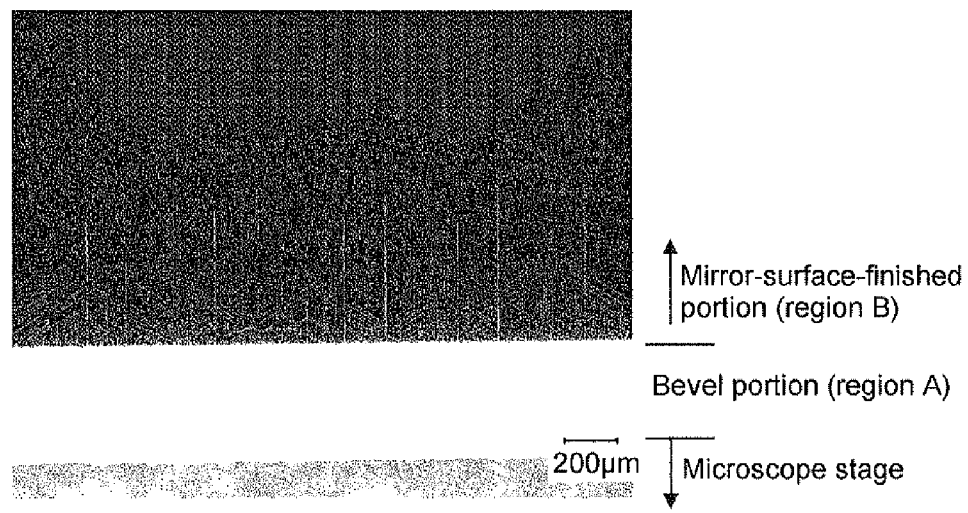
FIGS. 3(a) and 3(b) give appearance photographs of semiconductor devices in Comparative Example and Example of the present invention, respectively.
Figure 3B:
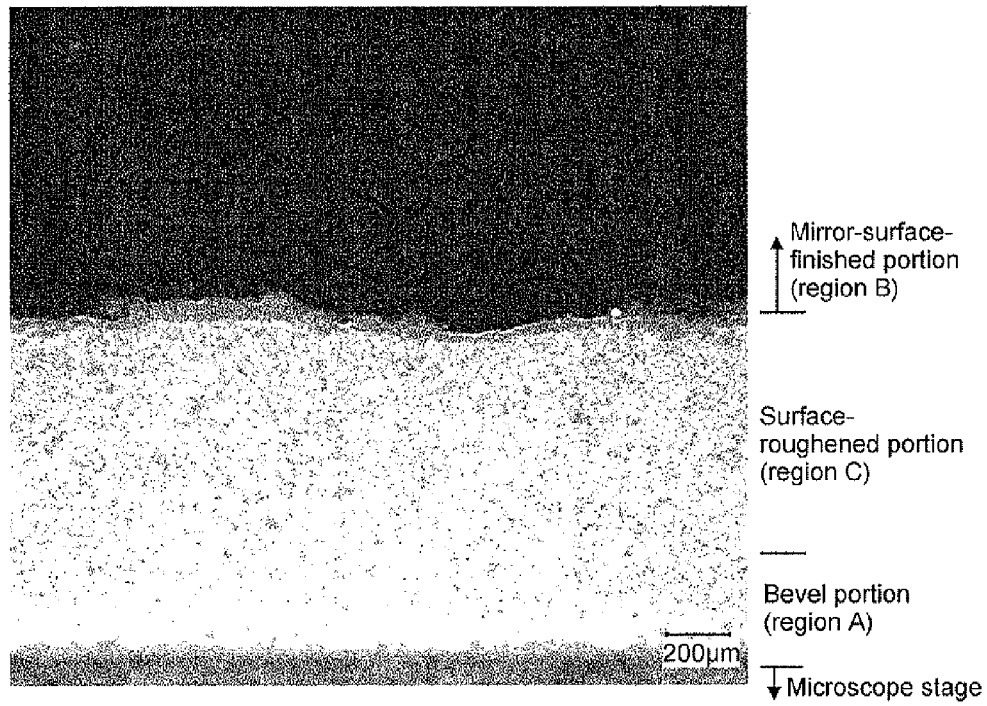

FIGS. 3(a) and 3(b) are appearance photographs of the orientation flat portion (on the 110 plane side) in the wafer edge portion in a case where a semiconductor device having the structure shown in FIG. 2 is formed using a Si single crystal substrate which is not provided with the region C in FIG. 1 (in Comparative Example), and in a case where a semiconductor device having the structure shown in FIG. 2 is formed using a Si single crystal substrate which is provided with the region C in FIG. 1 (in Example), respectively. Either photograph is a dark field image when viewed from diagonally above on the bevel portion (region A) side.

The Si single crystal substrate used was a 6-inch dia wafer manufactured by the CZ method (being B-doped) having a resistivity of 0.01 Ω·cm and a thickness of 650 µm. The wafer edge portion in Example was provided with a bevel which is shaped as shown in FIG. 1, the values of t and θ in FIG. 1 being equal to 300 µm and 22°, respectively. The bevel portion (region A) and the portion 0.5 mm to 2 mm inside thereof (region C) were subjected to a Microblast treatment over the entire periphery of the Si single crystal substrate such that the value of Ra was in the range of 100 to 1000 nm. The width of the region C in the orientation flat portion was 770 µm. In making the microblast treatment, the center portion (the region B) of the wafer was masked with a photoresist so as not to be surface-roughened, and after the treatment, the photoresist was removed.

In this Example, the photoresist as a mask was applied by hand, thereby the actual width of the region C being not uniform, varying within the above-mentioned range of 0.5 mm to 2 mm. However, by performing the photolithography, or carrying out coating by use of a spin coater with the edge rinse function, the width of the region C can be more exactly controlled with ease. Even in this case, it is obvious that the same effect can be obtained.

Further, measurement of the arithmetic mean surface roughness (Ra) was made using a stylus profilometer. The scanning distance in the measurement was 2 mm, and 5 portions (including the orientation flat portion) in the region C were selected for measurement. The measurements obtained in the five portions were Ra=180, 205, 215, 260, and 310 nm, the average of these being 234 nm. In Comparative Example (a mirror-surface-finished wafer), which was not subjected to the Microblast treatment, the measurements obtained in the same five portions were Ra=1.5, 2.0, 2.2, 2.5, and 2.5 nm, the average of these being 2.1 nm. From these results, it is obvious that the surface-roughening treatment increased the value of Ra.

The initial growth layer was formed of AlN, being 100 nm thick, while the first layer in the superlattice laminate was formed of AlN, being 4 nm thick, and the second layer was formed of $Al_{0.15}Ga_{0.85}N$, being 25 nm thick. The total number of laminations of the first layer and the second layer in the superlattice laminate was 75. The channel layer was formed of GaN, being 0.75 µm thick, and the electron supply layer was formed of n-type $Al_{0.27}Ga_{0.73}N$, being 18 nm thick. The C concentration actually measured with a SIMS (Secondary Ion-microprobe Mass Spectrometer) was $1×10^{19}$ cm$^{-3}$ in the superlattice laminate and was 0.8 to $3.0×10^{16}$ cm$^{-3}$ on the electron supply layer side of the channel layer.

In manufacturing a wafer having this structure, the MOCVD method using hydrogen and nitrogen as carrier gases was employed. As the group-III raw materials, Trimethyl Gallium (TMG) and Trimethyl Aluminum (TMA) were used, and as the nitrogen raw material, ammonia was used. For growth of the respective layers, the optimum conditions of gas pressure and substrate temperature as given in Table 1 were used. In forming the channel layer, the conditions were changed over between the initial stage (the buffer layer side) and the terminal stage (the electron supply layer side). The gas composition and the flow rate were set as appropriate according to the composition of the respective layers. These conditions were the same in either of Example and Comparative Example. Accordingly, Example and Comparative Example are the same except for presence or absence of the region C (surface-roughened portion) in the Si single crystal substrate.

TABLE 1

| Layer | Growth pressure (kPa) | Growth temperature (° C.) |
|---|---|---|
| Initial growth layer | 10 | 1000 |
| Superlattice laminate | 10 | 1000 |
| Channel layer (buffer layer side) | 10 | 1000 |
| Channel layer (electron supply layer side) | 100 | 1025 |
| Electron supply layer | 10 | 1025 |

In either of Comparative Example (FIG. 3(a)) and Example (FIG. 3(b)), the black portion which is visible on the upper side corresponds to the mirror-surface-finished portion (region B), and for this portion, it was confirmed that either of the growth layers (the buffer layer and the active layer) in FIG. 2 were formed of a single crystal, and the outermost surface thereof was a mirror-surface. The layers formed of the same constituting elements were formed in the bevel portion (region A) in Comparative Example and Example, and in the surface-roughened portion (region C) in Example, however, these layers were polycrystalline.

Figure 4:
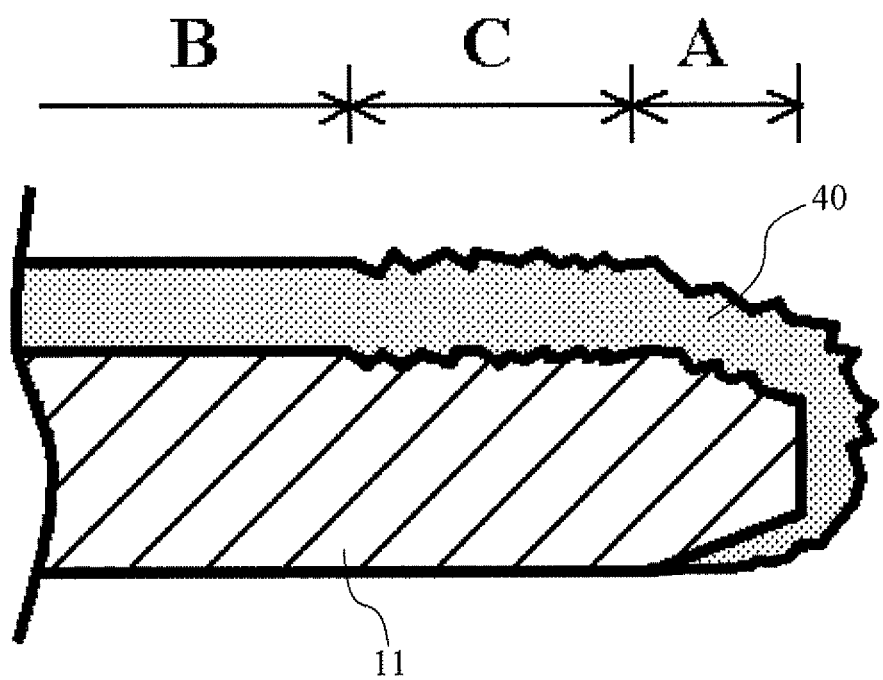
FIG. 4 is a drawing showing the outline of the sectional structure around the wafer edge portion in Example of the present invention.

FIG. 4 schematically shows the outline of the sectional geometry in the wafer edge portion and the vicinity thereof in Example (FIG. 3(b)). The growth layer 40 is formed from the front face of the Si single crystal substrate 11 to the rear face of the edge portion through the side face of the edge portion. The surface roughness of the polycrystalline layer just above the surface-roughened portion (region C) was 100 to 1000 nm Ra, as was the surface roughness of the Si single crystal substrate 11 in the region C. Further, the width of the polycrystalline region in the orientation flat portion except for the bevel portion was approximately 770 μm, which corresponds to the width of the surface-roughened portion (region C). Whether polycrystallization was effected or not was checked by making an X-ray diffraction (pole figure) measurement of the group-III nitride film to examine whether the crystal orientation is uniform or not. As a result of this, it was confirmed that, in the region C, a polycrystal which does not have a single crystal orientation was formed. For the front face of the growth layer 40 in the region B that was provided as a mirror-surface, it was confirmed that the Ra value was 2 nm or smaller, and in addition it was confirmed by the X-ray diffraction that a uniform crystal orientation was given. In other words, it was verified that, in the region B, a single crystal was grown. The Ra value measurement was performed by using the same stylus profilometer as that mentioned above.

It can be recognized that, in Comparative Example (FIG. 3(a)), the single crystal in this mirror-surface portion (in the region B) has a lot of cracks. Particularly, cracks which propagate diagonally upward in the figure and cracks which propagate upward in the figure are recognized. Either type of cracks are in the shape of a straight line, reflecting that the growth layer is a single crystal. Particularly the cracks which propagate upward are toward the center of the wafer, and therefore can obviously have an adverse influence on the semiconductor element formed in the active layer. In other words, they lower the yield rate for a semiconductor element manufactured using this epitaxial growth substrate.

On the other hand, in Example (FIG. 3(b)), no cracks are recognized in the mirror-surface-finished portion (the region B) of the growth layer. Therefore, in Example, the yield rate for a semiconductor element manufactured using this epitaxial growth substrate is increased. FIG. 3(b) shows the appearance of the orientation flat portion, however, in Example, no cracks were observed in any wafer edge portion other than this.

In Comparative Example, a possible cause for cracks initiating particularly in the edge portion is a non-uniformity in crystal growth. Especially in a case where a growth layer is formed by the MOCVD method, there occurs a slight difference in the growth conditions (the gas flow, temperature, and the like) between the center portion of the wafer (Si single crystal substrate) and the edge portion thereof. As disclosed in patent document 1, by optimizing the buffer layer, the lattice mismatch between the Si single crystal substrate and the active layer can be alleviated, however, the buffer layer for this purpose is generally optimized in the center portion where the semiconductor element is formed. Therefore, the composition of the buffer layer and the film thickness ratio for the superlattice laminate in the edge portion and the vicinity thereof differ from those which are optimized in the center portion. This causes cracks to easily initiate especially in the edge portion. However, on the Si single crystal substrate, a growth layer is formed as a single crystal which includes the center portion and the edge portion, thereby the cracks linearly propagate toward the center portion. Therefore, the cracks will have an adverse influence on the active layer (growth layer) in the center portion that has originally good characteristics.

Further, in a case where, as stated in patent document 2, a protection film is formed in the edge portion, the flow of gas is greatly changed in the edge portion, thereby a difference in the growth conditions is easily caused. With the present invention, the influence of the surface-roughened portion on the flow of gas is relatively small, and at the same time of a single crystal being grown in the center portion (the region B), a polycrystal is directly grown on the surface-roughened portion in the periphery of the center portion (in the regions C and A), thereby the region where a valid single crystal is obtained being maximized.

In Example, a polycrystal was formed in the surface-roughened portion (region C). This is because the surface-roughened portion has no single substrate surface, thereby a lot of crystal grains with different plane orientations having grown therein. Since the polycrystal is comprised of a lot of small crystal grains, cracks will not linearly propagate in the surface-roughened portion as would in the single crystal. In other words, although a microscopic examination would reveal that cracks similar to those as described above have initiated, such cracks will not extensively propagate, and the propagation will easily be stopped within the polycrystal. Therefore, not only in the mirror-surface-finished portion (the region B) of the growth layer, but also in the edge portion thereof, no cracks initiated.

Thus, with a polycrystal being grown in the surface-roughened portion (the region C), the above-mentioned effect is obtained. Accordingly, it is recommended that the surface-roughened portion of the Si single crystal substrate have a surface roughness which will not cause a single crystal to grow therein, but cause a polycrystal to grow therein. Specifically, the surface roughness is preferably 10 nm Ra, when expressed in arithmetic mean surface roughness, and is more preferably in the range of 100 nm to 1000 nm Ra. Further, if the width of the roughened surface portion is extremely narrow, the effect of suppressing the propagation of cracks will become insufficient, while the wider the width of the roughened surface portion, the smaller the area of the mirror-surface-finished portion (region B), which provides the region where a semiconductor element is to be formed, will be. Therefore, the width of the surface-roughened portion is preferably in the range of 0.5 mm to 2 mm; for example, 2 mm is preferable.

Further, in Example, the front faces of the surface-roughened portion and the bevel portion were both subjected to surface roughening, however, the front face or side face of the bevel portion (in the region A) may be either a mirror-surface-finished or a roughened surface. However, for example, when the MOCVD method is used, crystal growth is made also in the bevel portion, and in a layer grown therein, cracks may initiate and propagate toward the center portion. In order to suppress this, it is more preferable to subject the front face of the bevel portion to surface roughening.

The film thickness of the growth layer formed of a group-III nitride is set as appropriate according to the device characteristics, however, the film thickness need not be uniform on the wafer, and for example, may be thinner in the substrate peripheral portion. In this case, in the substrate edge portion, the occurrence of stresses is suppressed, with the initiation of cracks being suppressed to a higher degree. Therefore, reducing the film thickness of the buffer layer alone in the substrate peripheral portion will also be effective for suppressing the initiation of cracks.

In a case where the semiconductor element formed on an epitaxial growth substrate is a HEMT, there arises such a problem as that the cracks caused in the region where the HEMT is formed will be an obstacle to the operating current flowing in a direction parallel to the substrate surface, or that a leakage path is formed around the cracks, thereby the dielectric strength being lowered. Therefore, in a case where a semiconductor device in which the operating current flows in parallel to the principal surface of the substrate is to be structured, the above structure is particularly valid.

Growing a polycrystal only in the wafer edge portion may be implemented by using another method based on, for example, modifying the crystal growth conditions, or the like. However, providing a surface-roughened portion only around the principal surface of the Si single crystal substrate (wafer) can be performed, for example, immediately after the mirror surface finishing of the front face, thereby being capable of carried out at the time of manufacturing the Si single crystal substrate. The subsequent steps for forming a growth layer are implemented in the same way as conventional.

For the structure as described above, the plane orientation of the principal surface of the Si single crystal substrate 11 has been defined to be (111), however, even if the plane orientation is different from that, in a case where a growth layer, which is a single crystal, is formed thereon, the validity of the above-described structure is obvious in light of the fundamental concept thereof. In addition, it is also obvious that the above-described structure is not dependent on the existence or absence of the orientation flat or the notch, and the direction thereof.

Further, in the above-mentioned example, the buffer layer 20 has been defined to be constituted by the initial growth layer 21 and the superlattice laminate 22, however, so long as the active layer 30 having a good crystallinity can be obtained, the structure of the buffer layer is optional. For example, the initial growth layer alone may be used with no use of the superlattice laminate, or contrarily, the initial growth layer may not be used with the superlattice laminate being used. Further, the buffer having a graded composition may be used. The structure of the buffer layer is set as appropriate according to the degree of lattice mismatch between the Si and the material forming the active layer, the chemical reactivity between the Si and the material forming the active layer, the degree of nonconductivity required of the buffer layer, and the like. Further, it is obvious that, in a case where, without the use of the buffer layer, the Si single crystal substrate 11 itself having the above structure is used as the epitaxial growth substrate, and thereon, the active layer is directly grown, the same effect is provided.

Further, the above scheme is not limited to the combination of the Si single crystal substrate with a group-III nitride semiconductor, and is also applicable even in a case where a heteroepitaxial growth with which a lattice mismatch exists between the epitaxial growth substrate and the growth layer is performed. Especially, for a material, such as a group-III nitride semiconductor, with which a good quality bulk crystal is difficult to be obtained, and a good quality crystal can be obtained through heteroepitaxial growth, it is valid that the epitaxial growth substrate (the single crystal substrate) is provided with the same structure as described above.

DESCRIPTION OF SYMBOLS

10: epitaxial growth substrate
11: Si single crystal substrate
20: buffer layer
21: initial growth layer
22: superlattice laminate
30: active layer
31: channel layer
32: electron supply layer
40: growth layer
221: first layer
222: second layer

What is claimed:

1. An epitaxial growth substrate comprising:
a silicon single crystal substrate; and
a buffer layer made of a group-III nitride semiconductor and formed on a principal surface of the silicon single crystal substrate, the buffer layer forming: (i) a single crystal in a center portion of the principal surface of the silicon single crystal substrate, and (ii) a polycrystal in a region around the center portion on the principal surface of the silicon single crystal substrate;
wherein the center portion of the principal surface of the silicon single crystal substrate is mirror surface finished, and the region around the center portion on the principal surface of the silicon single crystal substrate is surface roughened.

2. The epitaxial growth substrate according to claim 1, wherein the arithmetic mean surface roughness in the region around the center portion that is surface roughened is 10 nm or higher.

3. The epitaxial growth substrate according to claim 1, wherein the silicon single crystal substrate has a tapered bevel portion in the peripheral portion located outside the principal surface, the bevel portion being surface roughened.

4. The epitaxial growth substrate according to claim 1, wherein the buffer layer includes a layer made of aluminum nitride (AlN).

5. The epitaxial growth substrate according to claim 1, wherein the buffer layer includes a superlattice structure.

6. A semiconductor device, comprising an epitaxial growth substrate according to claim 1, and an active layer made of a group-III nitride semiconductor formed on a principal surface of the epitaxial growth substrate.

7. The semiconductor device according to claim 6, wherein, in the active layer, an operating current is caused to flow in a direction parallel to the principal surface for operation thereof.

8. A method for producing the epitaxial growth substrate of claim 1, comprising:
- providing the single crystal substrate;
- a mirror surface finishing the center portion of the principal surface of the single crystal substrate;
- surface roughening the region around the center portion on the principal surface; and
- epitaxially growing a growth layer made of a material different from that of the single crystal substrate.

9. The epitaxial growth method according to claim 8, wherein the single crystal substrate is formed of silicon, and the growth layer is formed of a group-III nitride semiconductor.

* * * * *